United States Patent
Stanley et al.

(10) Patent No.: US 7,916,053 B2
(45) Date of Patent: Mar. 29, 2011

(54) ANALOG-TO-DIGITAL CONVERSION MODULE ADAPTED FOR IRREGULAR SAMPLING SEQUENCES

(75) Inventors: Michael E. Stanley, Mesa, AZ (US); Mark A. Lancaster, Scottsdale, AZ (US); Chongli Wu, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 106 days.

(21) Appl. No.: 12/414,245

(22) Filed: Mar. 30, 2009

(65) Prior Publication Data
US 2010/0245143 A1 Sep. 30, 2010

(51) Int. Cl.
*H03M 1/10* (2006.01)
(52) U.S. Cl. ........................................ 341/123; 341/141
(58) Field of Classification Search ............... 341/123, 341/141, 155
See application file for complete search history.

(56) References Cited

U.S. PATENT DOCUMENTS

| | | | | |
|---|---|---|---|---|
| 4,456,871 A | * | 6/1984 | Stich | 323/217 |
| 4,908,622 A | * | 3/1990 | Turai | 341/122 |
| 5,166,685 A | * | 11/1992 | Campbell et al. | 341/141 |
| 6,486,809 B1 | * | 11/2002 | Figoli | 341/141 |
| 7,142,140 B2 | | 11/2006 | Storvik et al. | |
| 2006/0015551 A1 | | 1/2006 | Ding | |

* cited by examiner

*Primary Examiner* — Howard Williams
(74) *Attorney, Agent, or Firm* — Ingrassia Fisher & Lorenz, P.C.

(57) ABSTRACT

Apparatus and methods are provided for performing a sampling sequence for a plurality of samples. An analog-to-digital conversion module comprises a sampling module, a register, and a sampling control module coupled to the sampling module and the register. The sampling module is configured to convert analog signals into corresponding digital values in response to sampling trigger signals and the register is configured to maintain scan mode criteria for a plurality of samples. The sampling control module is configured to identify a scan mode criterion for a respective sample of the plurality of samples, automatically generate a sampling trigger signal when the scan mode criterion for the respective sample is equal to a first value, and generate the sampling trigger signal in response to a timing trigger signal when the scan mode criterion for the respective sample is equal to a second value.

20 Claims, 5 Drawing Sheets

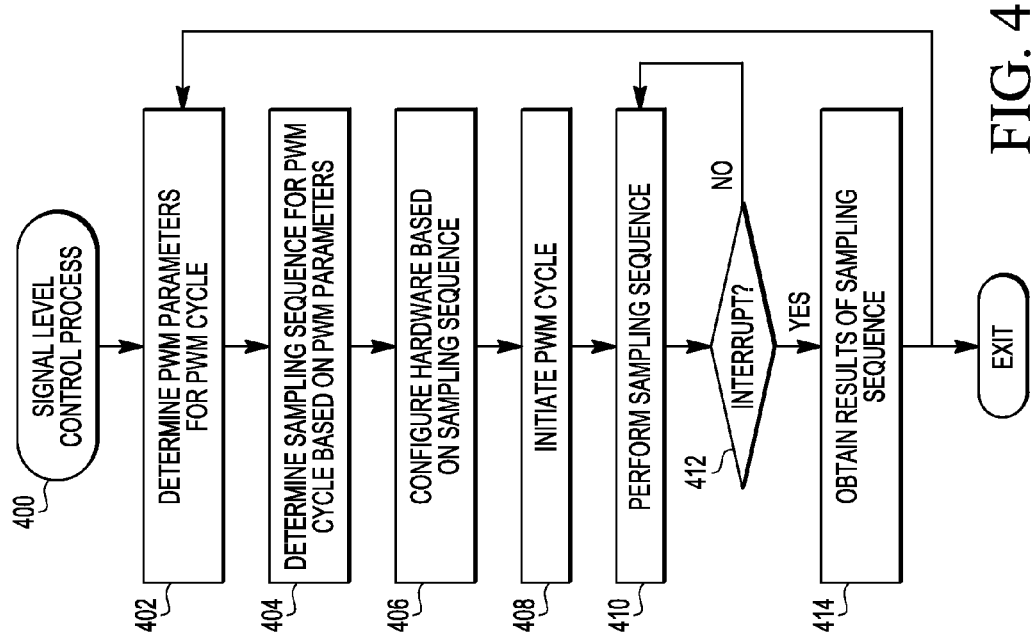

US 7,916,053 B2

ANALOG-TO-DIGITAL CONVERSION MODULE ADAPTED FOR IRREGULAR SAMPLING SEQUENCES

TECHNICAL FIELD

Embodiments of the subject matter described herein relate generally to electrical systems configured to perform a plurality of analog-to-digital conversions, and more particularly, embodiments of the subject matter relate to analog-to-digital conversion modules configurable for nonperiodic sampling sequences.

BACKGROUND

In many applications, pulse-width modulation (PWM) is used to control the supply of electrical power to another device (or electrical load). For example, PWM techniques may be used to regulate the voltage provided by an energy source to drive an electric motor. In general, PWM utilizes a square wave whose pulse width is modulated (that is, the duty cycle of the square wave is varied) such that the average value of the waveform is equal to the desired output signal level. For example, switched-mode power supplies utilize transistors which are turned on and off with a duty cycle based on previously determined PWM commands, such that the average voltage at the output of the switched-mode power supply is substantially (or approximately) equal to the desired voltage level for the electrical load connected to the output. Often, the output voltage level is measured and used to dynamically adjust the duty cycles for the PWM signals for upcoming intervals by comparing the measured output voltage level to a desired voltage level. For example, if the desired voltage level is greater than the measured output voltage level, the duty cycle of the PWM signal may be increased. In this manner, the duty cycles for the PWM signals may be dynamically determined and adjusted based on real-time operating conditions.

In general, it is desirable to measure or obtain the output voltage level at known times within a PWM interval (the period of the current PWM signals). In this regard, some prior art systems measure the output voltage levels based on a predetermined sequence by performing a fixed number of analog-to-digital conversions spaced at fixed intervals that are not adjustable during operation. The predetermined sequence runs to completion before generating an interrupt service request which is subsequently handled and/or processed by software. However, when the PWM signals are dynamically determined, the particular times when it is desirable to measure the output voltage level may vary for each PWM interval. Other prior art systems support scheduling the predetermined sequence for analog-to-digital conversions based on a hardware trigger signal, thereby allowing the sequence to begin at a different time within the PWM interval. However, the fixed intervals between analog-to-digital conversions are not adjustable. Thus, in order to schedule and perform analog-to-digital conversions in an irregular and/or dynamic manner that varies by PWM interval, the prior art results in a relatively high number of interrupts and software overhead. As the frequency of the PWM signals increases, the software overhead limits the ability to dynamically schedule and/or perform a desired number of analog-to-digital conversions during the PWM interval.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 4 is a flow diagram of a signal level control process suitable for use with the electrical system of FIG. 1 in accordance with one embodiment of the invention;

FIG. 5 is a table of an exemplary sampling sequence suitable for use with the signal level control process of FIG. 4 in accordance with one embodiment of the invention;

DETAILED DESCRIPTION

Figure 1:
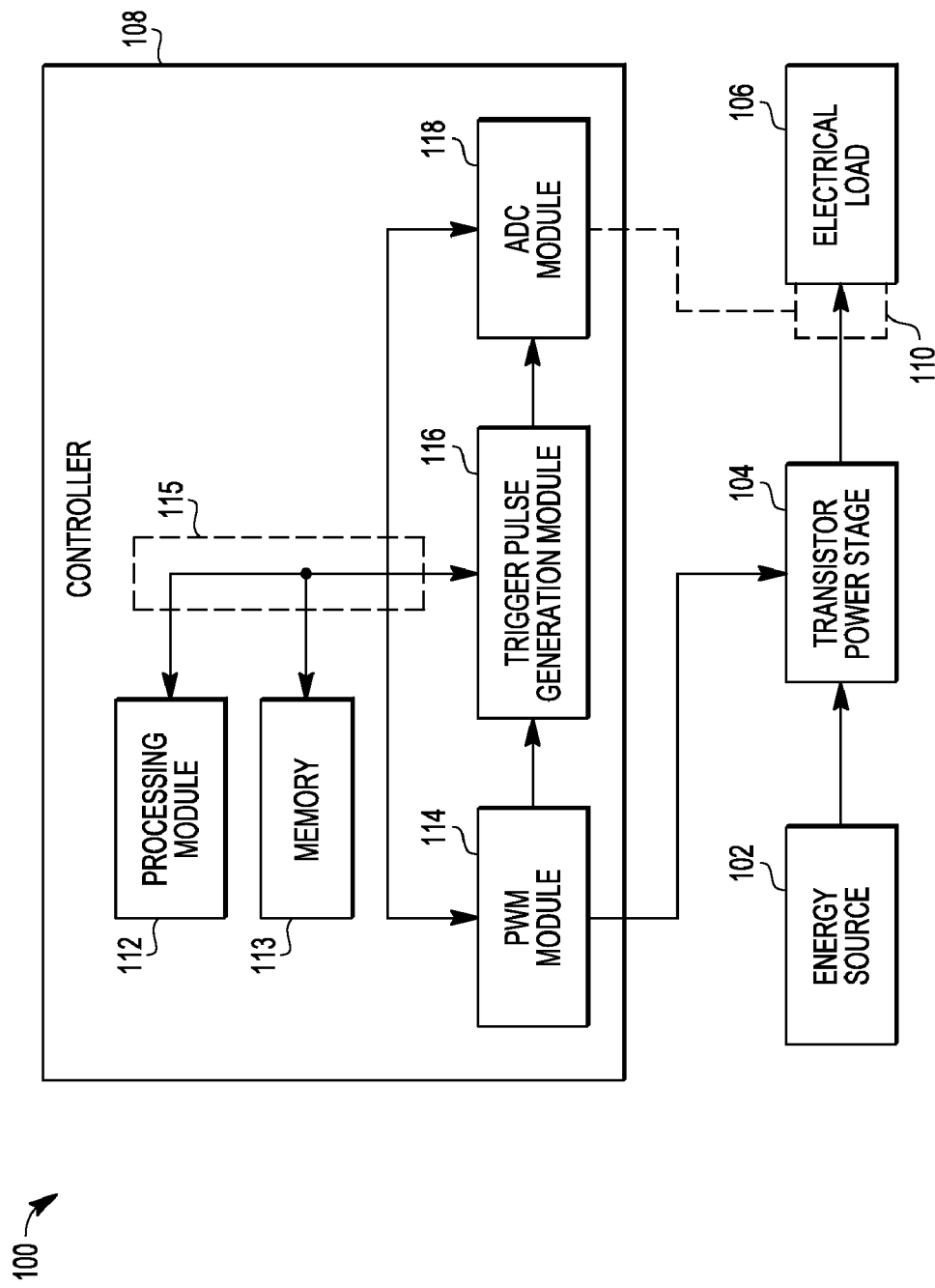
FIG. 1 is a block diagram of an electrical system in accordance with one embodiment of the invention.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

The following description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Unless expressly stated otherwise, "coupled" means that one element is directly or indirectly joined to (or directly or indirectly communicates with) another element, and not necessarily mechanically. Thus, although the schematics shown in the figures depict exemplary arrangements of elements, additional intervening elements, devices, features, or components may be present in an embodiment of the depicted subject matter. In addition, certain terminology may also be used in the following description for the purpose of reference only, and thus are not intended to be limiting. For example, terms such as "first", "second" and other such numerical terms referring to structures do not imply a sequence or order unless clearly indicated by the context.

For the sake of brevity, conventional techniques related to signal processing, sampling, sensing, analog-to-digital conversion, computer architecture, pulse-width modulation (PWM), and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. It should be understood that circuitry described herein may be implemented either in silicon or another semiconductor material or alternatively by software code representation thereof.

Technologies and concepts discussed herein relate to systems and methods for performing analog-to-digital conversions or samples based on a desired sampling sequence comprising a plurality of samples scheduled in an nonperiodic manner, that is, the sampling time associated with each sample of the sampling sequence may be independent of the sampling time associated with the other samples of the sampling sequence. In this regard, the time period between a first sample and a second sample following the first sample is independent of, and may be different from, the time period between the second sample and a third sample following the second sample. The individual samples of the sampling sequence may be precisely scheduled, either in regards to the preceding sample or a hardware event. The hardware for performing the samples is configured at the beginning of each PWM interval, such that the sampling sequence may be completely performed by hardware without interrupts during execution.

FIG. 1 depicts an exemplary embodiment of an electrical system 100. In an exemplary embodiment, the electrical system 100 includes, without limitation, an energy source 102, a transistor power stage 104, an electrical load 106, and a controller 108. In an exemplary embodiment, the energy source 102 is coupled to the transistor power stage 104, which in turn, is coupled to the electrical load 106. The controller 108 is coupled to the transistor power stage 104 and the electrical load 106, and the elements of the electrical systems 100 are suitably configured to provide electrical power from the energy source 102 to the electrical load 106 using pulse-width modulation (PWM) by operating the transistor power stage 104 under control of the controller 108, as described in greater detail below. It should be understood that FIG. 1 is a simplified diagram of the electrical system 100 for purposes of explanation, and FIG. 1 is not intended to limit the scope of the subject matter in anyway.

Depending on the embodiment, the energy source 102 may be realized as an alternating current (AC) energy source or a direct current (DC) energy source. For example, depending on the embodiment, the energy source 102 may be realized as a battery, a fuel cell, a mains electrical supply, or another suitable energy source known in the art. Similarly, depending on the embodiment, the electrical load 106 may be realized as an AC electrical load or a DC electrical load. The electrical load 106 may be realized as any suitable electrical load, such as, for example, a motor or another suitable electrical component.

In an exemplary embodiment, the transistor power stage 104 is configured to regulate the voltage level (or input current level) provided by the energy source 102 to the input 110 of the electrical load 106. In this regard, the transistor power stage 104 comprises one or more transistors (or switches) configured such that modulating (i.e., turning on or off) the one or more transistors produces a corresponding change in the voltage level at (or input current to) the electrical load 106, wherein the voltage level at (or input current to) the electrical load 106 is directly proportional to the duty cycle (i.e., the percentage or proportion of time which the transistor is in the "on" or saturated state). In this regard, the controller 108 is preferably configured to determine PWM signals for modulating the transistor power stage 104 in order to produce a regulated signal level at the input 110 of the electrical load 106.

In an exemplary embodiment, the transistor power stage 104 comprises a switching circuit realized as part of a switched-mode power supply, such as, for example, a rectifier, an inverter, a converter, and the like. For example, in accordance with one embodiment, the energy source 102 is a DC energy source (e.g., a battery, the output of an AC-DC converter, the output of a DC-DC converter) and the electrical load 106 is a DC load (e.g., the internal components of a computer), wherein the transistor power stage 104 is configured as a voltage converter having a plurality of transistor switches configured such that modulating the transistor switches produces an effective DC voltage level suitable for the electrical load 106 at the input 110 to the electrical load 106. In this embodiment, the transistor power stage 104 comprises as a voltage regulated output which is coupled to the input 110 of the electrical load 106. It should be appreciated that in practice, the transistor power stage 104 may operate in conjunction with and/or include suitably configured electrical energy storage devices, such as capacitors and/or inductors, diodes, and other suitably configured electrical circuitry.

The controller 108 generally represents the hardware, software, and/or firmware components configured to control or otherwise regulate the voltage at the input 110 of the electrical load 106 and perform additional tasks and/or functions described in greater detail below. In practice, the controller 108 may be realized as a system-on-a-chip, such as, for example, a digital signal controller (or DSC). In an exemplary embodiment, the controller 108 comprises a processing module 112, a memory 113, a PWM module 114, a trigger pulse generation module 116, and an analog-to-digital conversion (ADC) module 118. It should be appreciated that in practice, the controller 108 may also include additional peripheral modules suitably configured to support operation of the electrical system 100. In an exemplary embodiment, the processing module 112 is communicatively coupled to the memory 113, the PWM module 114, the trigger pulse generation module 116, and the ADC module 118 over a parallel bus interface 115, although in practice, another suitably configured bus, shared interface, or another interconnection arrangement may be used. In accordance with one embodiment, the processing module 112 and the peripheral modules 114, 116, 118 each receive a clocking signal having a clock frequency ($f_{CLK}$) such that the components of the controller 108 operate in a synchronous manner, as will be appreciated in the art. In an exemplary embodiment, the PWM module 114 is coupled to the trigger pulse generation module 116, which in turn is coupled to the ADC module 118. It should be noted that although not shown in FIG. 1, in practice, the PWM module 114 may be communicatively coupled to the trigger pulse generation module 116 over the bus interface 115, and likewise, the trigger pulse generation module 116 may be communicatively coupled to the ADC module 118 over the bus interface 115.

Depending on the embodiment, the processing module 112 may be implemented or realized with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. The processing module 112 may also be implemented as a combination of computing devices, e.g., a combination of a digital signal processor and a microprocessor, a plurality of microprocessors, one or more microprocessors in conjunction with a digital signal processor core, or any other such configuration. In practice, the processing module 112 includes processing logic that may be configured to carry out the functions, techniques, and processing tasks associated with the operation of the controller 108, as described in greater detail below. Furthermore, the steps of a method or algorithm described in connection with the embodiments disclosed herein may be embodied directly in hardware, in firmware, in a software module executed by the processing module 112, or in any practical combination thereof. In this regard, the processing module 112 may access a suitable amount of memory 113 configured to support operations of the controller 108, as described below. In this regard, the memory 113 may be realized as RAM memory, ROM memory, flash memory, registers, a hard disk, a removable disk, or any other form of storage medium known in the art or any suitable combination thereof. It should be noted that although the memory 113 and the processing module 112 are shown as separate elements, in practice, the memory 113 may be integral with the processing module 112, as will be appreciated in the art.

In the illustrated embodiment, the PWM module 114 generally represents the hardware, software, and/or firmware components configured to utilize PWM signals to modulate the transistors of the transistor power stage 104 based on a set of PWM parameters determined and/or provided by the processing module 112, as described in greater detail below. The trigger pulse generation module 116 generally represents the hardware components configured to generate timing trigger signals for the ADC module 118, as described in greater detail below. In an exemplary embodiment, the timing trigger signal comprises a pulse signal which causes the ADC module 118 to perform an analog-to-digital conversion in response to the timing trigger signal. In accordance with one embodiment, the trigger pulse generation module 116 generates timing trigger signals for a state machine within the ADC module 118 which causes the ADC module 118 to perform an analog-to-digital conversion based on the current state of the state machine within the ADC module 118, wherein after performing the action the state machine transitions to its next state.

The ADC module 118 generally represents the hardware components coupled to the input 110 of the electrical load 106 configured to obtain and/or sample the voltage level at the input 110 of the electrical load 106. In this regard, the ADC module 118 and/or controller 108 may be coupled to the input 110 of the electrical load 106 via one or more analog sensors (e.g., voltage and/or current sensors). In an exemplary embodiment, the ADC module 118 samples and/or performs an analog-to-digital conversions at particular sampling times based in part on one or more timing trigger signals provided by the trigger pulse generation module 116, as described in greater detail below. In accordance with one or more embodiments, the ADC module 118 is configured to perform a sampling sequence for a plurality of samples and generates an interrupt after obtaining the plurality of samples in accordance with the sampling sequence. As described in greater detail below, the ADC module 118 is configurable to obtain a sample at in response to a timing trigger signal or by automatically performing an analog-to-digital conversion after a previous sample. As used herein, "automatically performing an analog-to-digital conversion," "automatically converting," "automatically sampling," "automatically obtaining a sample," "automatically generating a sampling trigger signal," and variations thereof should be understood as referring to sampling an analog signal at a sampling time based on the sampling time of the immediately preceding sample. Depending on the embodiment, the sampling time of the automatically obtained sample may occur at the next possible sampling time after the previous sampling time (e.g., the sampling time of an immediately preceding sample) or at some other interval after the previous sampling time. In this regard, if a first sample is obtained at a first sampling time ($T_N$) in response to a timing trigger signal, a second sample automatically obtained after the first sample is obtained at a second sampling time ($T_N+\Delta$), where $\Delta$ represents an amount of time between successive samples.

Figure 2:
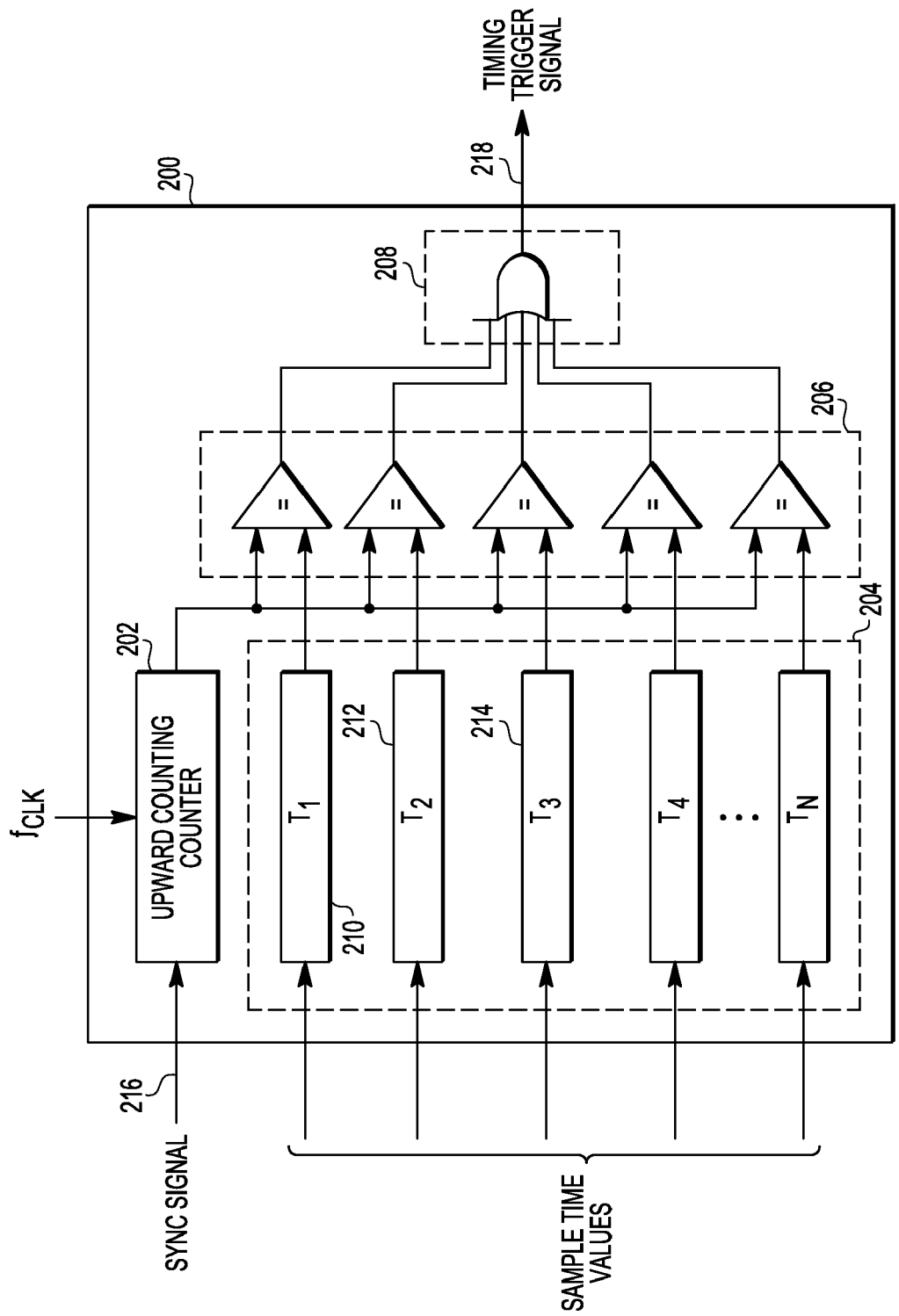
FIG. 2 is a block diagram of a trigger pulse generation module suitable for use in the electrical system of FIG. 1 in accordance with one embodiment of the invention.

FIG. 2 depicts an exemplary embodiment of a trigger pulse generation module 200 suitable for use as a trigger pulse generation module 116 in the electrical system 100 of FIG. 1. In an exemplary embodiment, the trigger pulse generation module 200 includes, without limitation, a counter 202, a plurality of registers 204, a plurality of digital comparators 206, and a logical OR gate 208. It should be noted that although FIG. 2 depicts the registers 204 within the trigger pulse generation module 200, in practice, the registers 204 may be implemented as part of memory 113 and communicatively coupled to the trigger pulse generation module 200. As described in greater detail below, in an exemplary embodiment, the trigger pulse generation module 200 is configured to provide one or more timing trigger signals 218 to the ADC module 118 based on the value of the counter 202 and the values stored in the plurality of registers 204. In this regard, the trigger pulse generation module 200 comprises N number of registers 204 and N number of comparators 206 suitably configured to support operation of the trigger pulse generation module 200, as described in greater detail below. It should be appreciated that FIG. 2 is a simplified diagram of the trigger pulse generation module 200 for purposes of explanation, and FIG. 2 is not intended to limit the scope of the subject matter in anyway. In this regard, the trigger pulse generation module 200 may be configured for any number of timing trigger signals, and practical embodiments may include additional components suitably configured to support operation of the trigger pulse generation module 200.

The counter 202 is preferably configured as synchronous upward counting counter which initializes and/or resets to a zero value in response to a sync signal 216. In an exemplary embodiment, the sync signal 216 is generated by the PWM module 114. In this regard, the sync signal 216 should be understood as referring to a pulse signal from the PWM module 114 that corresponds to the PWM module 114 beginning a new cycle, as described in greater detail below. In an exemplary embodiment, the registers 204 are coupled to the processing module 112 and configured to store digital values (e.g., sample time values) that correspond to particular sampling times (or timing references) after the sync signal 216 is received from the PWM module 114 such that the trigger pulse generation module 200 generates timing trigger signals 218 at the particular times after the sync signal 216. The value stored in each respective register 204 is equal to the value of a desired time (e.g., $T_N$) for a respective timing trigger signal multiplied by the clocking frequency of the counter 202 (e.g., $f_{CLK}$). As shown in FIG. 2, each register 204 is coupled to the input of digital comparator 206, and each digital comparator 206 has another input coupled to the counter 202 and configured to receive the current value (or count) of the counter 202. In an exemplary embodiment, the digital comparators 206 are configured such that the output of a respective comparator 206 is a logical '1' when the value of the counter 202 is equal to the value stored in the register 204 associated with the respective comparator 206, and otherwise, the output of the respective comparator 206 is a logical '0'. The logical OR gate 208 comprises N number of inputs, wherein each input is coupled to an output of a respective comparator 206, and the output of the logical OR gate 208 is preferably coupled to the ADC module 118, as described in greater detail below. In this manner, when the output of any of the digital comparators 206 is a logical '1', the output of the logical OR gate 208 changes to a logical '1' and thereby generates a timing trigger signal 218. In this manner, the trigger pulse generation module 200 generates any number of timing trigger signals 218 for the ADC module 118, wherein each timing trigger signal is generated at a particular time after the sync signal 216 from the PWM module 114, as described in greater detail below.

Figure 3:
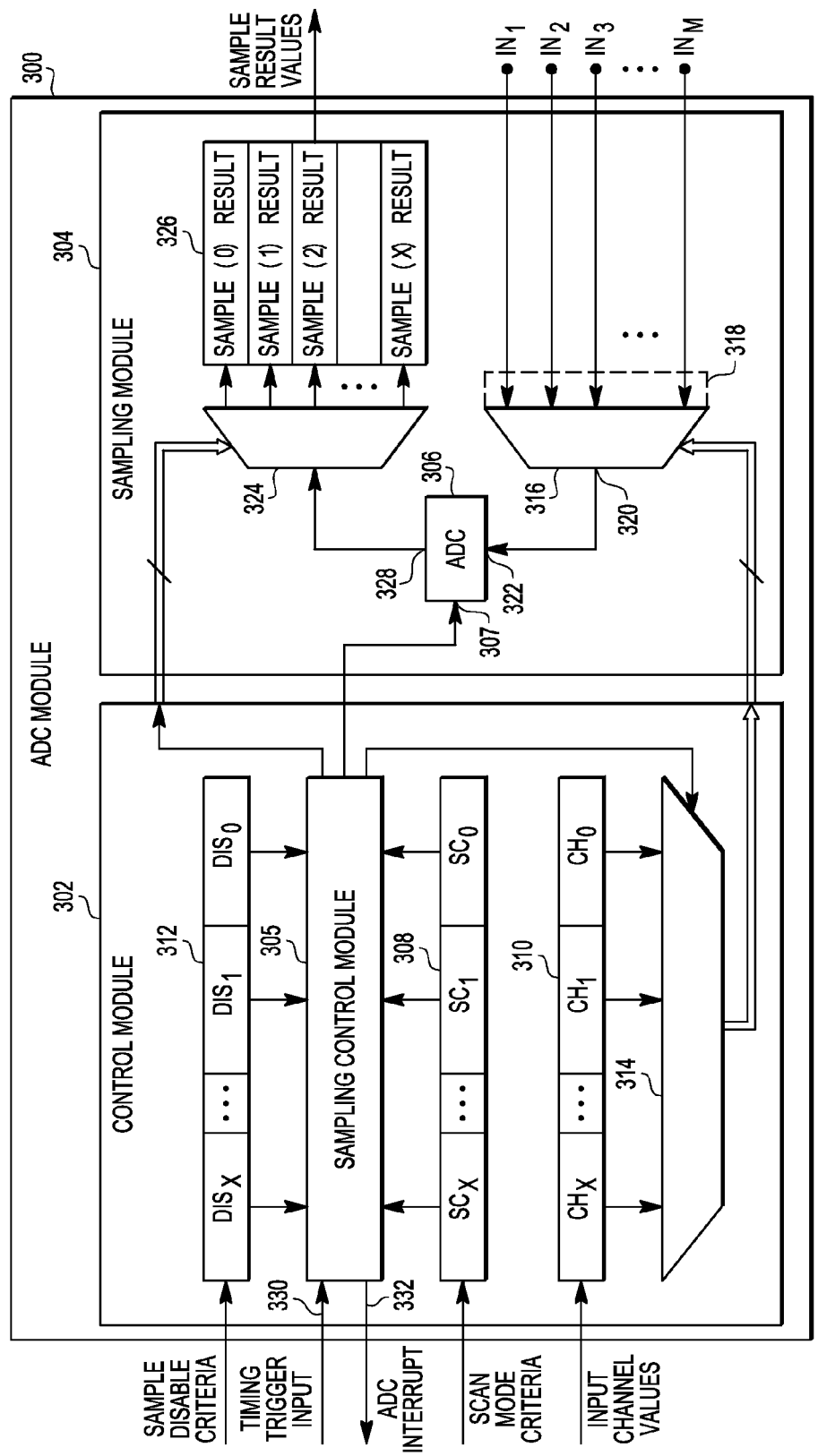
FIG. 3 is a block diagram of an analog-to-digital conversion module suitable for use in the electrical system of FIG. 1 in accordance with one embodiment of the invention.

FIG. 3 depicts an exemplary embodiment of an ADC module 300 suitable for use as an ADC module 118 in the electrical system 100 of FIG. 1. In an exemplary embodiment, the ADC module 300 includes, without limitation, an ADC control module 302 and a sampling module 304. The ADC control module 302 represents the hardware components configured to cause the hardware components of the sampling module 304 to identify and/or select a desired analog input, convert the analog input to a corresponding digital value, and store the digital value in an appropriate location, as described in greater detail below. It should be appreciated that FIG. 3 is a simplified diagram of the ADC module 300 for purposes of explanation, and FIG. 3 is not intended to limit the scope of the subject matter in anyway.

In an exemplary embodiment, the ADC control module 302 includes a sampling control module 305, a scan mode register 308, a channel list register 310, a sample disable register 312, and a channel selection multiplexer 314. It should be noted that although FIG. 3 depicts the registers 308, 310, 312 within the ADC control module 302, in practice, the registers 308, 310, 312 may be implemented as part of memory 113 and communicatively coupled to the ADC control module 302. The sampling control module 305 is coupled to the scan mode register 308, the sample disable register 312 and the channel selection multiplexer 314. In an exemplary embodiment, the sampling control module 305 is also communicatively coupled to the trigger pulse generation module 116, 200 (e.g., at the output of the logical OR gate 208) and the processing module 112. The registers 308, 310, 312 are coupled to the processing module 112 and configured to store values corresponding to particular samples of a sampling sequence determined by the processing module 112, as described in greater detail below. As described in greater detail below, the sample disable register 312 stores and/or maintains sample disable criteria that is utilized to control the number of samples obtained by the ADC module 300.

The sampling control module 305 is configured to generate sampling trigger signals (or alternatively, ADC trigger signals) at a trigger input 307 of the analog-to-digital converter (ADC) 306 within the sampling module 304 in response to either a timing trigger signal at a timing trigger input 330 or based on a scan mode criterion from the scan mode register 308 for a respective sample. As described in greater detail below, in an exemplary embodiment, the timing trigger input 330 is coupled to the trigger pulse generation module 116, 200 and configured to receive timing trigger signals 218 from the trigger pulse generation module 116, 200. In accordance with one embodiment, the sampling control module 305 is realized as a state machine configured to carry out the functions, techniques, and processing tasks associated with a scan mode sampling process, as described in greater detail below. However, in other embodiments, the sampling control module 305 may be realized with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein.

In an exemplary embodiment, the ADC 306 is realized as a Nyquist rate cyclic ADC that converts an analog signal level at the analog input 322 of the ADC 306 into a corresponding digital value at the digital output 328, in response to a sampling trigger signal (or alternatively, an ADC trigger signal) at its trigger input 307. In this regard, the sampling trigger signal comprises to a pulse signal provided by the sampling control module 305 to the trigger input 307 of the ADC 306 which causes the ADC 306 to perform an analog-to-digital conversion. In effect, the sampling trigger signal functions as a start signal or an enable signal for the ADC 306. It should be noted that in practice, the ADC 306 may be realized using any suitable analog-to-digital converter type (e.g., flash ADC, sigma-delta ADC, and the like) that is capable of performing analog-to-digital conversions in response to a sampling trigger signal from the sampling control module 305. In an exemplary embodiment, the ADC 306 converts the analog signal level at the analog input 322 to a multi-bit digital value at the digital output 328, however, in other embodiments, the ADC 306 may convert the analog signal at the analog input 322 to a single-bit digital value as will be appreciated in the art. As described in greater detail below, in some embodiments, the ADC 306 may have a minimum time ($\Delta$) between obtaining successive samples, or in other words, the minimum time ($\Delta$) corresponds to the minimum difference in sampling times for two successive samples.

In an exemplary embodiment, the sampling module 304 includes an analog input multiplexer 318 having a plurality of analog inputs 320, a digital demultiplexer 324 and a result register 326. The output 320 of the input multiplexer 316 is coupled to the analog input 322 of the ADC 306, and the input of the digital demultiplexer 324 is coupled to the digital output 328 of the ADC 306. The channel list register 310 comprises identification information, such as, for example, input channel values that correspond to a particular input of the plurality of inputs 320 to the sampling module 304 for a respective sample. As described in greater detail below, the input channel values stored and/or maintained in the channel list register 310 are based on a predetermined sampling sequence. The output of the channel selection multiplexer 314 is coupled to the selection input of the analog input multiplexer 316, and the sampling control module 305 and the channel selection multiplexer 314 are cooperatively configured to select the appropriate input channel for a respective sample of the sampling sequence based on the contents of the channel list register 310 that correspond to the respective sample, as described in greater detail below. In an exemplary embodiment, the sampling control module 305 is also coupled to the selection input of the digital demultiplexer 324, and the sampling control module 305 and the digital demultiplexer 324 are cooperatively configured such that the digital value obtained by the ADC 306 is stored or maintained in the appropriate location within the result register 326 that corresponds to the appropriate sample. In this regard, the digital demultiplexer 324 has a plurality of outputs coupled to the result register 326, wherein the sampling control module 305 selects the appropriate output for a respective sample.

Referring now to FIG. 4, in an exemplary embodiment, an electrical system may be configured to perform a signal level control process 400 and additional tasks, functions, and operations described below. The various tasks may be performed by software, hardware, firmware, or any combination thereof. For illustrative purposes, the following description may refer to elements mentioned above in connection with FIG. 1, FIG. 2, and FIG. 3. In practice, the tasks, functions, and operations may be performed by different elements of the described system, such as the controller 108, processing module 112, PWM module 114, trigger pulse generation module 116, 200 and/or ADC module 118, 300. It should be appreciated that any number of additional or alternative tasks may be included, and may be incorporated into a more comprehensive procedure or process having additional functionality not described in detail herein.

Referring to FIG. 4, and with continued reference to FIG. 1, FIG. 2 and FIG. 3, a signal level control process 400 may be performed to control and/or regulate the signal level at the output of a transistor power stage 104 and/or the input 110 of an electrical load 106. In an exemplary embodiment, the signal level control process 400 initializes or begins by determining a set of PWM parameters for an upcoming PWM cycle (task 402). The set of PWM parameters should be understood as referring to the parameters and/or commands used by the PWM module 114 to generate PWM signals (e.g., square waves) having the desired duty cycle and/or scheduling for operating the various switches of the transistor power stage 104 to produce a desired voltage level at the output of the transistor power stage 104 (i.e., the input 110 of the electrical load 106). In this regard, as used herein, a PWM cycle should be understood as referring to a time period having a duration equal to the period of the modulation waveform (e.g., a triangle waveform, a sawtooth waveform, or another suitable waveform) used to generate and/or determine the duty cycles for the PWM signals. For example, if the modulation waveform is a triangle wave, the length or duration of the PWM cycle is equal to the period of the triangle waveform, i.e., from trough to trough or peak to peak. In other words, the duration of the PWM cycle is equal to the inverse of the frequency of the modulation waveform used to generate the PWM signals. For switched-mode power supplies, the frequency of the modulation waveform may range from about 100 kHz to 500 kHz or more. In an exemplary embodiment, the processing module 112 determines the set of PWM parameters for the upcoming PWM cycle by comparing the measured voltage level(s) at the input 110 of the electrical load 106 from the previous PWM cycle (e.g., task 414) to a desired output voltage level. The processing module 112 provides the set of PWM parameters to the PWM module 114, which in turn generates the desired PWM signals for operating the transistor power stage 104 to produce the desired output voltage level.

In an exemplary embodiment, the signal level control process 400 continues by determining a desired sampling sequence for the upcoming PWM cycle based on the set of PWM parameters for the upcoming PWM cycle (task 404). As used herein, a sampling sequence should be understood as comprising a plurality of samples which are arranged in a particular order based on the set of PWM parameters (or the expected PWM signals) for the upcoming PWM cycle. In an exemplary embodiment, the sampling sequence comprises a sampling schedule, that is, particular timing for each sample of the sampling sequence. In this manner, each sample of the plurality of samples corresponds to digital value that represents to a particular analog signal level for a particular input to the ADC module 118, 300 at a particular instant in time. For each sample of the sampling sequence, the processing module 112 determines the desired timing for the respective sample and the desired input signal to the ADC module 118, 300 for sampling based on the set of PWM parameters. After the sampling sequence is performed (e.g., tasks 410, 412, 414), each sample comprises a digital value corresponding to an analog-to-digital conversion performed by the ADC module 118, 300 on a particular input to the ADC module 118, 300 at a particular time, as described in greater detail below.

FIG. 5 depicts an exemplary sampling sequence comprising five samples arranged in order based on the sampling schedule. As shown, each sample is associated with a particular input and a particular sampling time after the beginning of the PWM cycle. For example, a first sample corresponds to sampling a first input ($IN_1$) of the ADC module 118, 300 at a first time ($T_1$), a second sample corresponds to sampling a second input ($IN_2$) of the ADC module 118, 300 at a second time ($T_2$), and so on. Depending on the particular PWM parameters, the processing module 112 may determine that it is desirable to process samples in a substantially simultaneous manner, that is, such that a second sample occurs immediately and/or automatically after a preceding sample (e.g., at the next possible sampling time). For example, it may be desirable to sample the same input multiple times in a substantially simultaneous manner and average the samples to obtain an average signal level for a particular instant in time. As shown, the third sample corresponds to automatically sampling the second input ($IN_2$) of the ADC module 118, 300 immediately (i.e., at the next possible sampling time) after the second sample ($T_2+\Delta$, where $\Delta$ is equal to the minimum amount of time between samples based on the ADC 306) and the fifth sample corresponds to automatically sampling the third input ($IN_3$) of the ADC module 118, 300 immediately (e.g., at the next available sampling time) after the fourth sample ($T_3+\Delta$).

In an exemplary embodiment, the processing module 112 determines scan mode criteria for each sample of the sampling sequence based on the sampling schedule. In this regard, the scan mode criteria indicate whether a sample should be automatically obtained, or alternatively, obtained in response to a hardware event. For example, as described in greater detail below, a scan mode criterion equal to a logical '1' indicates a sample to be performed immediately and/or automatically after the preceding sample (e.g., automatic sampling mode) while a scan mode criterion equal to logical '0' corresponds to a sample to be performed at a particular time after the PWM sync signal (e.g., after the PWM cycle begins). In other words, a scan mode criterion equal to logical '1' corresponds to a sampling time referenced relative to the preceding sample, whereas a scan mode criterion equal to logical '0' corresponds to a sampling time reference relative to an external event (e.g., the sync signal indicating the beginning of the PWM cycle). As shown, the scan mode criteria for the first, second, and fourth samples are determined as logical '0', as the timing for each of the respective samples is referenced relative to the beginning of the PWM cycle, whereas the scan mode criteria for the third and fifth samples are determined as logical '1', as the timing for each of the third and fifth samples is reference relative to the timing of the preceding sample. As a result, a time interval (or difference) between the first sample and the second sample (e.g., $T_2-T_1$) may be different than a time interval between the second sample and the third sample (e.g., $\Delta$), which may be different than a time interval between the third sample and the fourth sample (e.g., $T_4-T_2-\Delta$), and so on. In this regard, the sampling time for each sample of the sampling sequence may be independent of the other samples of the sampling sequence. In other words, the sampling sequence may be nonperiodic, that is, at least one sample does not occur at regular intervals with respect to the preceding and/or succeeding samples. It should be noted that although the scan mode criteria is described herein as a single-bit value for purposes of explanation, the scan mode criteria may be implemented using additional bits and the subject matter is not intended to be limited to single-bit scan mode criteria.

Referring again to FIG. 4, with continued reference to FIGS. 1-3 and FIG. 5, in an exemplary embodiment, the signal level control process 400 continues by configuring the hardware components of the controller for the upcoming PWM cycle based on the sampling sequence (task 406). In an exemplary embodiment, the processing module 112 configures the trigger pulse generation module 116, 200 to generate timing trigger signals corresponding to the particular timing references after the PWM sync signal based on the sampling schedule for the sampling sequence. For example, using the sampling sequence of FIG. 5 as an example, the processing module 112 may configure the first register 210 to contain (or store) a value corresponding to $T_1$ (e.g., $T_1 \times f_{CLK}$), a second register 212 to contain a value corresponding to $T_2$ (e.g., $T_2 \times f_{CLK}$), and a third register 214 to contain a value corresponding to $T_3$ (e.g., $T_3 \times f_{CLK}$). The processing module 112 may also configure each of the remaining registers 204 (e.g., registers for $T_4$ through $T_N$) which are not being used for the current sampling sequence to contain (or store) a null value or another suitable value such that the trigger pulse generation module 200 does not generate any undesired timing trigger signals that may interfere with the proper execution of the sampling sequence. In this manner, the trigger pulse generation module 116, 200 generates a plurality of timing trigger signals based on the sampling schedule during execution of the upcoming PWM cycle, as described in greater detail below.

In an exemplary embodiment, the processing module 112 also configures the ADC module 118, 300 for generating sampling trigger signals at the trigger input 307 of the ADC 306 based on the sampling sequence. In this regard, the scan mode register 308 obtains the scan mode criteria for the plurality of samples of the sampling sequence from the processing module 112. In an exemplary embodiment, the scan mode criteria are arranged in a sequential manner within the scan mode register 308, for example, a first bit of the scan mode register 308 corresponds to the first sample of the sampling sequence, a second bit of the scan mode register 308 corresponds to the second sample of the sampling sequence, and so on. In this regard, using the sampling sequence of FIG. 5 as an example, the first five bits of the scan mode register 308 may comprise 00101 such that scan mode criteria associated with the particular samples of the sampling sequence correspond to those determined or identified above (e.g., task 404). In an exemplary embodiment, the processing module 112 also configures the ADC module 118, 300 with other information for performing the sampling sequence. For example, the processing module 112 may configure the channel list register 310 such that the appropriate input channel for the sampling module 304 is selected based on the sampling sequence, as described in greater detail below. As described in greater detail below, the processing module 112 may also configure the sample disable register 312 with sample disable criteria such that the ADC module 300 does not obtain additional samples other than those prescribed by the sampling sequence. In an exemplary embodiment, the ADC module 300 and/or sampling control module 305 generates an interrupt signal 332 (alternatively referred to as the ADC interrupt) in response to determining that all the samples of the sampling sequence have been obtained based on the contents of the sample disable register 312, as described in greater detail below.

In an exemplary embodiment, in response to configuring the hardware components for the upcoming PWM cycle, the signal level control process 400 continues by initiating the upcoming PWM cycle (task 408). Depending on the embodiment, the processing module 112 may indicate to the PWM module 114 to begin the PWM cycle or the PWM module 114 may begin the PWM cycle automatically (e.g., without interaction of the processing module 112). The PWM module 114 generates PWM signals for the PWM cycle based on the set of PWM parameters determined and/or provided to the PWM module 114, as set forth above (e.g., task 402). In addition, in some embodiments, the processing module 112 may reset or otherwise initialize the state machine that comprises the sampling control module 305, such that the sampling control module 305 is restored to a first or initial state upon initiation of the PWM cycle.

In response to initiating the PWM cycle, in an exemplary embodiment, the signal level control process 400 continues by performing the sampling sequence determined above (e.g., task 404) until receiving an interrupt signal (tasks 410, 412). In this regard, the PWM module 114 may generate a sync signal when the PWM module 114 begins execution of the set of PWM parameters for the PWM cycle. In response to the sync signal 216 from the PWM module 114, the counter 202 within the trigger pulse generation module 200 begins counting upwards, such that the trigger pulse generation module 200 generates a plurality of timing trigger signals 218 at predetermined times (e.g., based on values stored in the registers 204) after the sync signal 216. The ADC module 118, 300 obtains the plurality of samples for the sampling sequence by performing a scan mode sampling process as described in greater detail below with reference to FIG. 6. In an exemplary embodiment, the ADC module 118, 300 generates an interrupt signal in response to completing the scan mode sampling process, and in response to the interrupt signal, the signal level control process 400 continues by obtaining the results of the sampling sequence, that is, the digital values corresponding to the plurality of samples of the sampling sequence (task 414). Depending on the particular embodiment, the signal level control process 400 may exit, or determine a set of PWM parameters for the next PWM cycle based upon the measured or otherwise obtained digital values that correspond to the plurality of samples by comparing the digital values obtained by the ADC module 118, 300 to the desired (or expected) values (e.g., values corresponding to the desired analog signal levels) (task 402). In this regard, the signal level control process 400 may determine a new set of modulation parameters for the next PWM cycle based on the digital values corresponding to the plurality of samples from the previous PWM cycle, determine a sampling sequence based on the new set of modulation parameters, and configure the controller hardware based on the sampling sequence, in a similar manner as described above. The loop defined by tasks 402, 404, 406, 408, 410, 412, and 414 may repeat as desired during operation of the electrical system 100.

Figure 6:
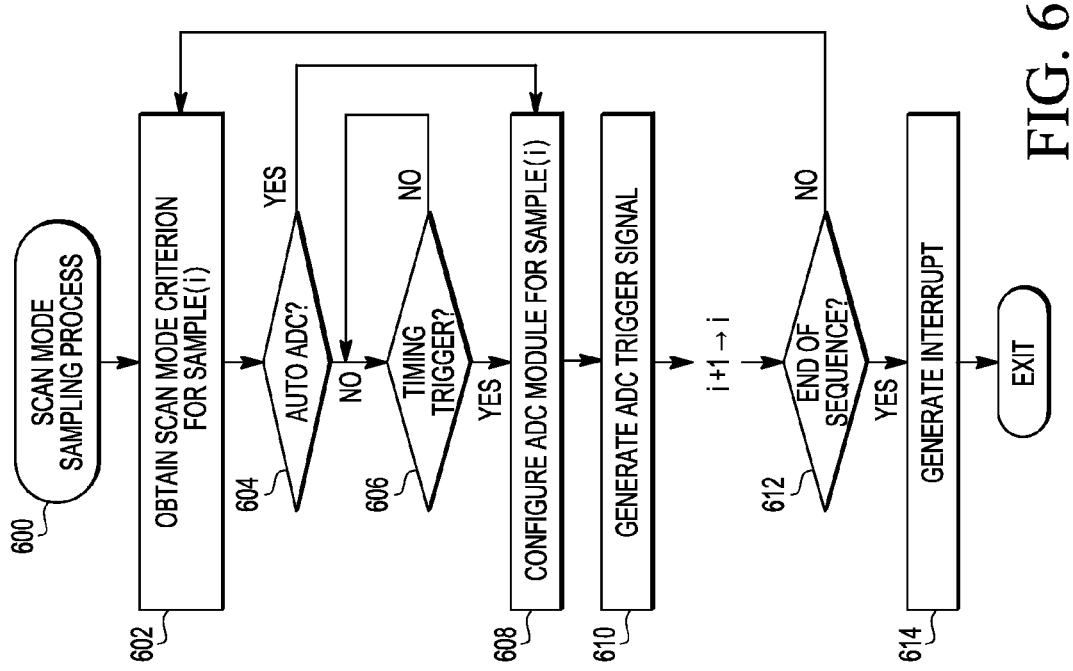
FIG. 6 is a flow diagram of a scan mode sampling process suitable for use with the signal level control process of FIG. 4 in accordance with one embodiment.

Referring now to FIG. 6, in an exemplary embodiment, an ADC module may be configured to perform a scan mode sampling process 600 and additional tasks, functions, and operations described below. The various tasks are preferably performed by hardware, firmware, or any combination thereof. For illustrative purposes, the following description may refer to elements mentioned above in connection with FIG. 1, FIG. 2, FIG. 3, FIG. 4, and FIG. 5. In practice, the tasks, functions, and operations may be performed by different elements of the described system, such as the controller 108, processing module 112, PWM module 114, trigger pulse generation module 116, 200, ADC module 118, 300, the ADC control module 302, the sampling module 304, the sampling control module 305, and/or the ADC 306. It should be appreciated that any number of additional or alternative tasks may be included, and may be incorporated into a more comprehensive procedure or process having additional functionality not described in detail herein.

Referring to FIG. 6, and with continued reference to FIGS. 1-5, a scan mode sampling process 600 may be performed to obtain a plurality of samples in accordance with a predetermined sampling sequence. In an exemplary embodiment, the scan mode sampling process 600 initializes or begins by obtaining and/or identifying the scan mode criterion corresponding to a first sample of the sampling sequence (task 602). In this regard, the sampling control module 305 may initialize or begin in a first state corresponding to the first sample of the sampling sequence. The sampling control module 305 obtains and/or identifies the scan mode criterion for the first sample of the sampling sequence from the scan mode register 308, for example, by analyzing the first bit of the scan mode register 308 when the sampling control module 305 is in the first state. The scan mode sampling process 600 continues by determining and/or identifying whether the scan mode criterion for first sample corresponds to an automatic sampling mode (e.g., an automatic analog-to-digital conversion) (task 604). For example, if the scan mode criterion corresponding to the first sample (e.g., the first bit of the scan mode register 308) is a logical '1', the sampling control module 305 may determine the first sample corresponds to the automatic sampling mode. In response to determining and/or identifying that the first sample corresponds to the automatic sampling mode, the scan mode sampling process 600 continues by configuring the ADC module for the first sample and generating a sampling trigger signal (tasks 608, 610), as described in greater detail below. In this regard, the scan mode sampling process 600 automatically generates the sampling trigger signal, that is, the sampling control module 305 generates the sampling trigger signal independently of any other hardware events or external trigger signals. It should be noted that although the subject matter may be described herein in the context of two sampling criteria (or two sampling modes) for purposes of explanation, in practice, additional sampling criteria and/or sampling modes may be implemented depending on the needs of a particular application, and the subject matter is not intended to be limited to any number of sampling criteria and/or sampling modes.

In an exemplary embodiment, in response to determining and/or identifying that scan mode criterion for the first sample does not correspond to an automatic sampling mode, the scan mode sampling process 600 is configured to wait for a timing trigger signal from an external module (task 606). In other words, the scan mode criterion for the first sample corresponds to a trigger-based sampling mode. For example, if the scan mode criterion corresponding to the first sample (e.g., the first bit of the scan mode register 308) is a logical '0', the sampling control module 305 may determine and/or identify that the first sample does corresponds to the trigger-based sampling mode. In this regard, the sampling control module 305 is configured to wait until receiving a timing trigger signal at the timing trigger input 330 before taking any other action or transitioning from its current state. In an exemplary embodiment, the sampling control module 305 receives the timing trigger signal(s) 218 from the trigger pulse generation module 116, 200 (e.g., the output of the logical OR gate 208).

In response to either determining and/or identifying a scan mode criterion corresponding to the automatic sampling mode or in response to receiving a timing trigger signal, the scan mode sampling process 600 continues by configuring the ADC module for the respective sample (task 608). In this regard, the sampling control module 305 is coupled to the selection input of the channel selection multiplexer 314 and configured to select the input of the channel selection multiplexer 314 for the contents of the channel list register 310 that identify the appropriate input channel for the respective sample. In response, the output of the channel selection multiplexer 314 is coupled to the selection input of the analog input multiplexer 316 and selects the identified input channel such that the analog signal from the desired input for the sample is provided to the analog input 322 of the ADC 306. The sampling control module 305 is also coupled to the selection input of the digital demultiplexer 324 and selects the output of the plurality of outputs of the digital demultiplexer 324 that corresponds to the respective sample, such that the digital value for the respective sample is stored in a location in the result register 326 that corresponds to the respective sample. For example, for the first sample of the sampling sequence, the sampling control module 305 may configure the channel selection multiplexer 314 to select the desired input channel for the first sample from the channel list register 310 and configure the digital demultiplexer 324 to store the result of the first sample in a first result location within the result register 326.

In an exemplary embodiment, the scan mode sampling process 600 continues by generating or otherwise providing a sampling trigger signal to the trigger input of the ADC in the sampling module (task 610). In response to the sampling trigger signal at the trigger input 307, the ADC 306 converts the analog signal at its analog input 322 into a corresponding digital value at its digital output 328, which is then stored and/or maintained in the location within the result register 326 identified by the sampling control module 305 and/or digital demultiplexer 324. In accordance with one or more embodiments, if the scan mode criterion for the current sample corresponds to the automatic sampling mode, the sampling control module 305 generates the sampling trigger at the trigger input 307 at a particular sampling time equal to the minimum time between samples for the ADC 306 ($\Delta$) after the previous sampling trigger signal. In other words, in the automatic sampling mode, the sampling trigger signal is generated at a sampling time equal to the sampling time of the preceding sample plus the minimum time between samples. In an exemplary embodiment, after generating the sampling trigger signal, the scan mode sampling process 600 continues by identifying and/or selecting the next sample of the sampling sequence. In this regard, after generating a sampling trigger signal, the sampling control module 305 may transition to a subsequent state corresponding to the next sample of the sampling sequence.

In an exemplary embodiment, after proceeding to the next sample, the scan mode sampling process 600 determines whether the sampling sequence has been completed (task 612). In an exemplary embodiment, the sampling control module 305 obtains the value from the sample disable register 312 that corresponds to the respective sample of the sampling sequence. If the value in the sample disable register 312 that corresponds to the identified sample (e.g., the sample disable criterion) indicates that the sampling sequence is complete, the scan mode sampling process 600 generates an interrupt and exits (task 614). For example, if the value from the sample disable register 312 that corresponds to the identified sample is a logical '1' (e.g., indicating the sample is disabled), the sampling control module 305 may generate or otherwise provide an interrupt signal 332 to the processing module 112. If the value from the sample disable register 312 indicates that the sampling sequence is not complete (e.g., the value is a logical '0'), the scan mode sampling process 600 repeats by obtaining the scan mode criterion corresponding to the respective sample and repeating the loop defined by tasks 602, 604, 606, 608, 610, 612, and 614 until all the samples of the sampling sequence have been obtained and the sampling sequence is complete.

Figure 7:
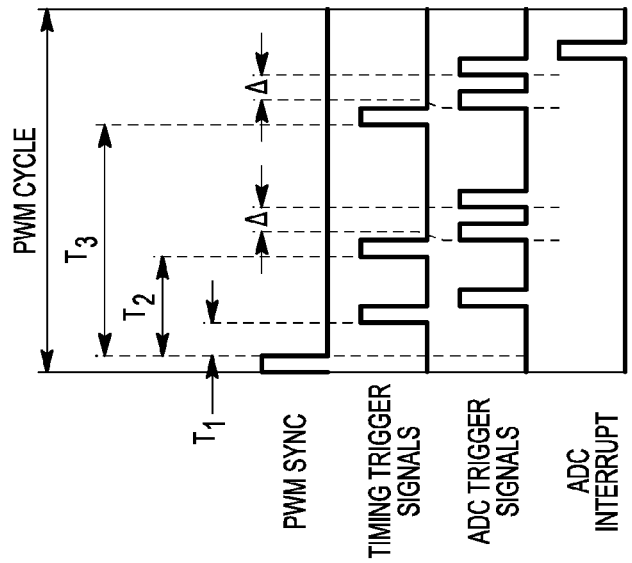
FIG. 7 is a diagram that includes graphs of various signals versus time for a PWM cycle associated with the operation of a signal level control process based on the sampling sequence of FIG. 5 for an exemplary embodiment of the invention.

Referring now to FIG. 7, and with continued reference to FIGS. 1-6, in an exemplary embodiment, the PWM module 114 generates a sync signal (PWM SYNC) at the beginning of the PWM cycle. In response to the sync signal 216 from the PWM module 114, the counter 202 of the trigger pulse generation module 200 begins incrementing on the next rising clock edge. The sampling control module 305 obtains and/or identifies the scan mode criterion for the first sample of the sampling sequence. For example, using the exemplary sampling sequence of FIG. 5, the sampling control module 305 obtains and/or identifies the scan mode criterion for the first sample (e.g., logical '0') of the sampling sequence, which indicates that the ADC module 300 should wait for an external timing trigger signal before obtaining or otherwise performing the first sample. In this regard, when the counter 202 of the trigger pulse generation module 200 is equal to the value corresponding to the first time ($T_1$), the trigger pulse generation module 200 generates a first timing trigger signal 218 at the timing trigger input 330 of the ADC module 300. In response to the first timing trigger signal, the sampling control module 305 configures the channel selection multiplexer 314 and the digital demultiplexer 324 such that the first sample is obtained based on a first input ($IN_1$) of the plurality of analog inputs 320 and the corresponding digital value is stored in the result register 326 such that it is associated with the first sample. The sampling control module 305 generates an ADC sampling trigger signal at the ADC trigger input 307 which causes the ADC 306 to convert the value at its analog input 322 (e.g., the output 320 of the analog input multiplexer 318) to a digital value which corresponds to the analog signal level of the first input ($IN_1$) at the first time ($T_1$).

In an exemplary embodiment, after generating the sampling trigger signal for the first sample, the sampling control module 305 transitions to a second state that corresponds to the second sample of the sampling sequence. After determining that the second sample is not disabled, the sampling control module 305 obtains and/or identifies the scan mode criterion for the second sample of the sampling sequence (e.g., logical '0'), which indicates that the ADC module 300 should wait for an external timing trigger signal before obtaining or otherwise performing the second sample. When the counter 202 of the trigger pulse generation module 200 is equal to the value corresponding to the second time ($T_2$), the trigger pulse generation module 200 generates a second timing trigger signal 218. In response to the second timing trigger signal, the sampling control module 305 configures the channel selection multiplexer 314 and the digital demultiplexer 324 such that the second sample is obtained based on a second input ($IN_2$) in a similar manner as described above. After generating the sampling trigger signal for the second sample, the sampling control module 305 transitions to a third state corresponding to the third sample. After determining that the third sample is not disabled, the sampling control module 305 obtains and/or identifies the scan mode criterion for the third sample of the sampling sequence. In this case, the scan mode criterion for the third sample is a logical '1', indicating that the ADC module 300 should automatically perform the sample without waiting for an external timing trigger signal. In this regard, the sampling control module 305 configures the channel selection multiplexer 314 and the digital demultiplexer 324 such that the third sample is obtained based on a second input ($IN_2$) in a similar manner as described above. The sampling control module 305 automatically generates a sampling trigger signal at the trigger input 307 of the ADC 306, such that the third sample is automatically and/or immediately obtained by the ADC 306 after the second sample.

In a similar manner, after generating the sampling trigger signal for the third sample, the sampling control module 305 transitions to a fourth state corresponding to the fourth sample. After determining that the fourth sample is not disabled, the sampling control module 305 obtains and/or identifies the scan mode criterion for the fourth sample of the sampling sequence, which indicates that the ADC module 300 should wait for an external timing trigger signal before obtaining or otherwise performing the fourth sample. When the counter 202 of the trigger pulse generation module 200 is equal to the value corresponding to the third time ($T_3$), the trigger pulse generation module 200 generates a third timing trigger signal 218. In response to the third timing trigger signal, the sampling control module 305 configures the channel selection multiplexer 314 and the digital demultiplexer 324 such that the fourth sample is obtained based on a third input ($IN_3$) in a similar manner as described above. After generating the sampling trigger signal for the fourth sample, the sampling control module 305 transitions to a fifth state corresponding to the fifth sample. After determining that the fifth sample is not disabled, the sampling control module 305 obtains and/or identifies the scan mode criterion for the fifth sample of the sampling sequence, which indicates that the ADC module 300 should automatically perform the fifth sample without waiting for an external timing trigger signal. In this regard, the sampling control module 305 configures the channel selection multiplexer 314 and the digital demultiplexer 324 such that the fifth sample is obtained based on the third input ($IN_3$) in a similar manner as described above. The sampling control module 305 automatically generates a sampling trigger signal, such that the fifth sample is automatically and/or immediately obtained after the fourth sample.

In an exemplary embodiment, after generating the sampling trigger signal for the fifth sample, the sampling control module 305 transitions to a sixth state corresponding to the sixth sample. In this exemplary case, because the sampling sequence of FIG. 5 only prescribes five samples, the value in the sample disable register 312 corresponding to a sixth sample may be configured to indicate that the sixth sample is disabled (e.g., logical '1') based on the current sampling sequence. The sampling control module 305 may determine that the sampling sequence has been completed (e.g., task 612), and in response, the sampling control module 305 generates an interrupt signal 332 for the processing module 112 (e.g., task 614). In an exemplary embodiment, in response to the interrupt signal, the processing module 112 obtains the values for the samples of the sampling sequence (e.g., the sample result values) from the result register 326 (e.g., task 414) and repeats the signal level control process 400 based on the samples obtained for the sampling sequence, as described above in the context of FIG. 4. In this regard, the signal level control process 400 and the scan mode sampling process 600 may be cooperatively configured to repeat as desired during operation of the electrical system 100.

To briefly summarize, the signal level control process 400 and/or scan mode sampling process 600 may be performed to regulating a voltage level at a voltage regulated output by regulating the voltage level by providing PWM signals to a switching circuit during a first PWM cycle and sampling the voltage level during the PWM cycle at a plurality of sampling times using an analog-to-digital conversion module. The analog-to-digital conversion module is configured to convert the analog signal level to a corresponding digital value a plurality of sampling times resulting in a plurality of samples for the first PWM cycle. As best shown by FIG. 7, the analog-todigital conversion module may be configured to obtain the plurality of samples that comprise a sampling sequence by sampling the analog signal at nonperiodic intervals without generating an interrupt until the sampling sequence is completed. In this regard, at least some of the sampling times of the plurality of samples may be nonperiodic with respect to the other sampling times of the plurality of sampling times. For example, as shown in FIG. 7, the first sampling time ($T_1$) and the second sampling time ($T_2$) are nonperiodic with respect to the third sampling time ($T_2+\Delta$), that is, the difference (or time interval) between the first sampling time (or first sample) and the second sampling time (or second sample) is not equal to the difference (or time interval) between the second sampling time and the third sampling time (or third sample), i.e., $T_2-T_1 \neq \Delta$. Similarly, the second and third sampling times are nonperiodic with respect to the fourth sampling time, and the third and fourth sampling times are nonperiodic with respect to the fifth sampling time.

One advantage of the systems and/or methods described above is that the samples for a predetermined sampling sequence for a PWM cycle may be scheduled and/or obtained at irregular intervals using hardware components. The samples may be scheduled to occur at a particular time relative to the beginning of the PWM cycle or relative to a previous sample (e.g., automatically after a previous sample). After the controller hardware is configured for the sampling sequence, the hardware may then perform the sampling sequence until all the samples have been obtained before generating an interrupt. In this manner, once the hardware has been configured, the sampling sequence may be completed without any interrupt service requests or software overhead related to executing the sampling sequence.

In summary, systems, devices, and methods configured in accordance with example embodiments of the subject matter relate to:

An apparatus is provided for an analog-to-digital conversion module. In an exemplary embodiment, the analog-to-digital conversion module comprises a sampling module, a register, and a sampling control module coupled to the sampling module and the register. The sampling module is configured to convert analog signals into corresponding digital values in response to sampling trigger signals and the register is configured to maintain scan mode criteria for a plurality of samples. The sampling control module is coupled to the register and the sampling module, and the sampling control module is configured to receive a timing trigger signal. The sampling control module identifies a scan mode criterion for a respective sample of the plurality of samples, automatically generates a sampling trigger signal when the scan mode criterion for the respective sample is equal to a first value, and generates the sampling trigger signal in response to the timing trigger signal when the scan mode criterion for the respective sample is equal to a second value. In an exemplary embodiment, the sampling module automatically generates the sampling trigger signal when the scan mode criterion for the respective sample is equal to the first value by generating the sampling trigger signal at a predetermined time after a preceding sampling trigger signal.

In accordance with one or more embodiments, the plurality of samples are based on a sampling sequence, wherein the sampling control module is configured to identify a first scan mode criterion corresponding to a first sample of the sampling sequence, automatically generate a first sampling trigger signal when the first scan mode criterion is equal to the first value, and generate the first sampling trigger signal in response to a first timing trigger signal when the first scan mode criterion is equal to the second value. In a further embodiment, the sampling control module is configured to identify a second scan mode criterion corresponding to a second sample of the sampling sequence in response to generating the first sampling trigger signal, and automatically generate a second sampling trigger signal at a second sampling time when the second scan mode criterion is equal to the first value. The second sampling time is equal to a predetermined time after the first sampling time corresponding to the first sampling trigger signal. When the second scan mode criterion is equal to the second value, the sampling control module generates the second sampling trigger signal in response to a second timing trigger signal when the second scan mode criterion is equal to the second value. In another embodiment, the sampling control module is configured to generate an interrupt signal in response to generating the sampling trigger signal. In yet another embodiment, the sampling module comprises an analog-to-digital converter coupled to the sampling control module. The analog-to-digital converter is configured to convert an analog signal at its input to a corresponding digital value in response to the sampling trigger signal. In a further embodiment, the sampling module comprises a multiplexer coupled to the sampling control module. The multiplexer has a plurality of multiplexer inputs and a multiplexer output coupled to the input of the analog-to-digital converter. The sampling control module is configured to select a first input of the plurality of multiplexer inputs corresponding to the respective sample of the plurality of samples when the scan mode criterion for the respective sample is equal to the first value, wherein the first input corresponds to a first analog signal. The analog-to-digital converter is converts the first analog signal to a digital value in response to the sampling trigger signal. In yet another embodiment, the sampling module comprises a demultiplexer coupled to the sampling control module. The demultiplexer has a plurality of demultiplexer outputs and an input configured to receive a digital value from the analog-to-digital converter. The sampling control module selects a first output of the plurality of demultiplexer outputs corresponding to the respective sample of the plurality of samples when the scan mode criterion for the respective sample is equal to the first value.

In another embodiment, an apparatus for a controller is provided. In an exemplary embodiment, the controller comprises a first module configured to generate a plurality of sampling trigger signals and an analog-to-digital conversion module configured to convert an analog signal into a corresponding digital value in response to the plurality of sampling trigger signals resulting in a plurality of samples. The plurality of samples comprise a first sampling sequence for a first cycle period, wherein each sampling trigger signal of the plurality of sampling trigger signals is configurable to either be automatically generated or generated at a respective sampling time within the first cycle period based on the first sampling sequence. In an exemplary embodiment, the first module is configured to automatically generate the a sampling trigger signal of the plurality of sampling trigger signals at a predetermined time after a sampling time associated with an immediately preceding sampling trigger signal of the plurality of sampling trigger signals. In accordance with one embodiment, the controller further comprises a register configured to maintain scan mode criteria for the plurality of samples. For each sample of the plurality of samples, the first module is configured to identify a scan mode criterion for a respective sample of the plurality of samples, automatically generate a sampling trigger signal at a predetermined time after an immediately preceding sampling trigger signal when the scan mode criterion for the respective sample is equal to a first value, and generate the sampling trigger signal in response to a timing trigger signal when the scan mode criterion for the respective sample is equal to a second value. In yet another embodiment, the analog-to-digital conversion module is configured to generate an interrupt signal in response to obtaining a final sample of the plurality of samples based on the first sampling sequence. In response to the interrupt signal, the first module is configured to determine a second sampling sequence for a second cycle period, the second sampling sequence comprising a second plurality of samples, and generate a second plurality of sampling trigger signals based on the second sampling sequence, wherein each sampling trigger signal of the second plurality of sampling trigger signals is configurable to either be automatically generated or generated at a respective sampling time within the second cycle period based on the second sampling sequence.

In another embodiment, a method for regulating a signal level at a regulated output is provided. In an exemplary embodiment, the method comprises regulating the signal level by providing a pulse-width modulated signal to a switching circuit, and sampling by an analog-to-digital conversion module the signal level at a plurality of sampling times. The analog-to-digital conversion module converts the signal level to a corresponding digital value at each sampling time of the plurality of sampling times resulting in a plurality of samples for a first modulation cycle, wherein at least some sampling times of the plurality of sampling times are nonperiodic with respect to the other sampling times of the plurality of sampling times. In accordance with one embodiment, the method further comprises regulating the signal level by providing a second pulse-width modulated signal to the switching circuit, the second pulse-width modulated signal being based on the plurality of samples for the first modulation cycle, and sampling by the analog-to-digital conversion module the signal level at a second plurality of sampling times. The analog-to-digital conversion module converts the signal level to a corresponding digital value at each sampling time of the second plurality of sampling times resulting in a second plurality of samples for a second modulation cycle, wherein at least some of the sampling times of the second plurality of sampling times are nonperiodic with respect to the other sampling times of the second plurality of sampling times.

In accordance with one embodiment, sampling the signal level at the plurality of sampling times comprises sampling the signal level at a first sampling time of the plurality of sampling times resulting in a first sample, and automatically sampling the signal level a second sampling time of the plurality of sampling times resulting in a second sample, wherein the second sampling time is equal to a predetermined time after the first sampling time. In yet another embodiment, sampling the signal level at the plurality of sampling times further comprises sampling the signal level at a third sampling time of the plurality of sampling times resulting in a third sample of the plurality of samples, wherein the third sample is nonperiodic with respect to the first sample and the second sample. In accordance with one embodiment, sampling the signal level at the plurality of sampling times comprises obtaining a first sample of the plurality of samples at a first sampling time of the plurality of sampling times by identifying a first scan mode criterion for the first sample. If the first scan mode criterion is equal to a first value, the analog-to-digital conversion module automatically converts the signal level to a first digital value. If the first scan mode criterion is equal to a second value, the analog-to-digital conversion module converts the signal level to the first digital value in response to a timing trigger signal corresponding to the first sampling time. The method further comprises storing the first digital value in memory, wherein the first digital value is associated with the first sample. In a further embodiment, sampling the signal level at the plurality of sampling times further comprises obtaining a second sample of the plurality of samples at a second sampling time of the plurality of sampling times by identifying a second scan mode criterion for the second sample. If the second scan mode criterion is equal to the first value, the method comprises automatically converting the signal level to a second digital value resulting in the second sample at the second sampling time. The second sampling time is equal to a predetermined time after the first sampling time. If the second scan mode criterion is equal to the second value, the method comprises converting the signal level to the second digital value in response to a second timing trigger signal corresponding to the second sampling time. The method further comprises storing the second digital value in memory, wherein the second digital value is associated with the second sample. In yet another embodiment, automatically converting the signal level to the second digital value comprises generating a sampling trigger signal for an analog-to-digital converter at the predetermined time after the first sampling time if the first scan mode criterion is equal to the first value, wherein the analog-to-digital converter converts the signal level to the second digital value in response to the sampling trigger signal. In accordance with yet another embodiment, sampling the signal level further comprises generating a plurality of timing trigger signals based on the plurality of sampling times and converting the signal level to the first digital value in response to a first timing trigger signal of the plurality of timing trigger signals when the first scan mode criterion is equal to the second value, the first timing trigger signal corresponding to the first sampling time.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An analog-to-digital conversion module comprising:
  a sampling module configured to convert analog signals into corresponding digital values in response to sampling trigger signals;
  a register configured to maintain scan mode criteria for a plurality of samples; and
  a sampling control module coupled to the register and the sampling module, the sampling control module being configured to receive a timing trigger signal, wherein the sampling control module is configured to:
    identify a scan mode criterion for a respective sample of the plurality of samples;
    automatically generate a sampling trigger signal when the scan mode criterion for the respective sample is equal to a first value; and
    generate the sampling trigger signal in response to the timing trigger signal when the scan mode criterion for the respective sample is equal to a second value.

2. The analog-to-digital conversion module of claim 1, wherein the sampling module is configured to automatically generate the sampling trigger signal when the scan mode criterion for the respective sample is equal to the first value by generating the sampling trigger signal at a predetermined time after a preceding sampling trigger signal.

3. The analog-to-digital conversion module of claim 1, the plurality of samples being based on a sampling sequence, wherein the sampling control module is configured to:
identify a first scan mode criterion corresponding to a first sample of the sampling sequence;
automatically generate a first sampling trigger signal when the first scan mode criterion is equal to the first value; and
generate the first sampling trigger signal in response to a first timing trigger signal when the first scan mode criterion is equal to the second value.

4. The analog-to-digital conversion module of claim 3, the first sampling trigger signal occurring at a first sampling time, wherein the sampling control module is configured to:
identify a second scan mode criterion corresponding to a second sample of the sampling sequence in response to generating the first sampling trigger signal; and
automatically generate a second sampling trigger signal at a second sampling time when the second scan mode criterion is equal to the first value, the second sampling time being equal to a predetermined time after the first sampling time; and
generate the second sampling trigger signal in response to a second timing trigger signal when the second scan mode criterion is equal to the second value.

5. The analog-to-digital conversion module of claim 1, wherein the sampling control module is configured to generate an interrupt signal in response to generating the sampling trigger signal.

6. The analog-to-digital conversion module of claim 1, wherein the sampling module comprises an analog-to-digital converter coupled to the sampling control module, the analog-to-digital converter having an input, wherein the analog-to-digital converter is configured to convert an analog signal at the input to a corresponding digital value in response to the sampling trigger signal.

7. The analog-to-digital conversion module of claim 6, wherein the sampling module comprises a multiplexer coupled to the sampling control module, the multiplexer having a plurality of multiplexer inputs and a multiplexer output coupled to the input of the analog-to-digital converter, wherein:
the sampling control module is configured to select a first input of the plurality of multiplexer inputs corresponding to the respective sample of the plurality of samples when the scan mode criterion for the respective sample is equal to the first value, the first input corresponding to a first analog signal; and
the analog-to-digital converter is configured to convert the first analog signal to a digital value in response to the sampling trigger signal.

8. The analog-to-digital conversion module of claim 6, wherein the sampling module comprises a demultiplexer coupled to the sampling control module, the demultiplexer having a plurality of demultiplexer outputs and an input configured to receive a digital value from the analog-to-digital converter, wherein the sampling control module is configured to select a first output of the plurality of demultiplexer outputs corresponding to the respective sample of the plurality of samples when the scan mode criterion for the respective sample is equal to the first value.

9. A controller comprising:
a first module configured to generate a plurality of sampling trigger signals based on a first sampling sequence for a first cycle period, the first sampling sequence comprising a plurality of samples, wherein each sampling trigger signal of the plurality of sampling trigger signals is configurable to either be automatically generated or generated at a respective sampling time within the first cycle period based on the first sampling sequence; and
an analog-to-digital conversion module configured to convert an analog signal into a corresponding digital value in response to the plurality of sampling trigger signals resulting in the plurality of samples.

10. The controller of claim 9, wherein the first module is configured to automatically generate the a sampling trigger signal of the plurality of sampling trigger signals at a predetermined time after a sampling time associated with an immediately preceding sampling trigger signal of the plurality of sampling trigger signals.

11. The controller of claim 9, further comprising a register configured to maintain scan mode criteria for the plurality of samples, wherein for each sample of the plurality of samples, the first module is configured to:
identify a scan mode criterion for a respective sample of the plurality of samples;
automatically generate a sampling trigger signal at a predetermined time after an immediately preceding sampling trigger signal when the scan mode criterion for the respective sample is equal to a first value; and
generate the sampling trigger signal in response to a timing trigger signal when the scan mode criterion for the respective sample is equal to a second value.

12. The controller of claim 9, wherein:
the analog-to-digital conversion module is configured to generate an interrupt signal in response to obtaining a final sample of the plurality of samples based on the first sampling sequence; and
in response to the interrupt signal, the first module is configured to:
determine a second sampling sequence for a second cycle period, the second sampling sequence comprising a second plurality of samples; and
generate a second plurality of sampling trigger signals based on the second sampling sequence, wherein each sampling trigger signal of the second plurality of sampling trigger signals is configurable to either be automatically generated or generated at a respective sampling time within the second cycle period based on the second sampling sequence.

13. A method for regulating a signal level at a regulated output, the method comprising:
regulating the signal level by providing a pulse-width modulated signal to a switching circuit; and
sampling by an analog-to-digital conversion module the signal level at a plurality of sampling times, wherein the analog-to-digital conversion module converts the signal level to a corresponding digital value at each sampling time of the plurality of sampling times resulting in a plurality of samples for a first modulation cycle, wherein at least some sampling times of the plurality of sampling times are nonperiodic with respect to the other sampling times of the plurality of sampling times.

14. The method of claim 13, further comprising:
regulating the signal level by providing a second pulse-width modulated signal to the switching circuit, the second pulse-width modulated signal being based on the plurality of samples for the first modulation cycle; and sampling by the analog-to-digital conversion module the signal level at a second plurality of sampling times, wherein the analog-to-digital conversion module converts the signal level to a corresponding digital value at each sampling time of the second plurality of sampling times resulting in a second plurality of samples for a second modulation cycle, wherein at least some of the sampling times of the second plurality of sampling times are nonperiodic with respect to the other sampling times of the second plurality of sampling times.

15. The method of claim 13, wherein sampling the signal level at the plurality of sampling times comprises:
  sampling the signal level at a first sampling time of the plurality of sampling times resulting in a first sample; and
  automatically sampling the signal level a second sampling time of the plurality of sampling times resulting in a second sample, wherein the second sampling time is equal to a predetermined time after the first sampling time.

16. The method of claim 15, wherein sampling the signal level at the plurality of sampling times further comprises sampling the signal level at a third sampling time of the plurality of sampling times resulting in a third sample of the plurality of samples, wherein the third sample is nonperiodic with respect to the first sample and the second sample.

17. The method of claim 13, wherein sampling the signal level at the plurality of sampling times comprises obtaining a first sample of the plurality of samples at a first sampling time of the plurality of sampling times by:
  identifying a first scan mode criterion for the first sample;
  if the first scan mode criterion is equal to a first value, automatically converting the signal level to a first digital value;
  if the first scan mode criterion is equal to a second value, converting the signal level to the first digital value in response to a timing trigger signal corresponding to the first sampling time; and
  storing the first digital value in memory, wherein the first digital value is associated with the first sample.

18. The method of claim 17, wherein sampling the signal level at the plurality of sampling times further comprises obtaining a second sample of the plurality of samples at a second sampling time of the plurality of sampling times by:
  identifying a second scan mode criterion for the second sample;
  if the second scan mode criterion is equal to the first value, automatically converting the signal level to a second digital value resulting in the second sample at the second sampling time, wherein the second sampling time is equal to a predetermined time after the first sampling time;
  if the second scan mode criterion is equal to the second value, converting the signal level to the second digital value in response to a second timing trigger signal corresponding to the second sampling time; and
  storing the second digital value in memory, wherein the second digital value is associated with the second sample.

19. The method of claim 18, wherein automatically converting the signal level to the second digital value comprises generating a sampling trigger signal for an analog-to-digital converter at the predetermined time after the first sampling time if the first scan mode criterion is equal to the first value, wherein the analog-to-digital converter converts the signal level to the second digital value in response to the sampling trigger signal.

20. The method of claim 17, wherein sampling the signal level further comprises:
  generating a plurality of timing trigger signals based on the plurality of sampling times; and
  converting the signal level to the first digital value in response to a first timing trigger signal of the plurality of timing trigger signals when the first scan mode criterion is equal to the second value, the first timing trigger signal corresponding to the first sampling time.

* * * * *